(12) United States Patent
Kim (10) Patent No.: US 6,859,404 B1
(45) Date of Patent: Feb. 22, 2005

(54) APPARATUS AND METHOD OF COMPENSATING FOR PHASE DELAY IN SEMICONDUCTOR DEVICE

(75) Inventor: Kyung-Hoon Kim, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 10/883,099

(22) Filed: Jun. 30, 2004

(30) Foreign Application Priority Data

Aug. 21, 2003 (KR) .................................. 10-2003-0057854

(51) Int. Cl.[7] .................................................. G11C 7/00
(52) U.S. Cl. ........................ 365/194; 365/191; 365/233; 365/189.05; 327/276; 327/278; 327/281; 327/161
(58) Field of Search ................................ 365/194, 191, 365/189.07, 189.05, 233; 327/261, 262, 276, 278, 281, 161

(56) References Cited

U.S. PATENT DOCUMENTS 5,117,135 A * 5/1992 Lee et al. ........................ 327/7
6,473,455 B1 * 10/2002 Kwon .......................... 375/228
6,549,052 B2 * 4/2003 Okayasu ...................... 327/276

\* cited by examiner

Primary Examiner—Andrew Q. Tran
(74) Attorney, Agent, or Firm—Blakely, Sokoloff Taylor & Zafman (57) ABSTRACT

An apparatus for minimizing a skew occurring due to a change of data pattern by previously recognizing data pattern before data is outputted from the semiconductor device. The apparatus of compensating for a phase delay in a semiconductor device having a delay locked loop (DLL) for generating DLL clock includes: a data pattern detection block for detecting patterns of data loaded on data line and determining delay compensation amount of the data inputted to data output driver based on the detected data patterns; and a delay compensation block for compensating for phase delay of clock relating to the DLL clock inputted to the data output driver under a control of an output signal of the data pattern detection block.

12 Claims, 14 Drawing Sheets

APPARATUS AND METHOD OF COMPENSATING FOR PHASE DELAY IN SEMICONDUCTOR DEVICE

FIELD OF THE INVENTION

The present invention relates to a semiconductor device; and, more particularly, to a semiconductor device which is capable of minimizing a skew occurring due to a change of data pattern. Specifically, the present invention relates to a semiconductor device, which is capable of previously recognizing data pattern before data is outputted from the semiconductor device.

DESCRIPTION OF RELATED ART

Figure 1:
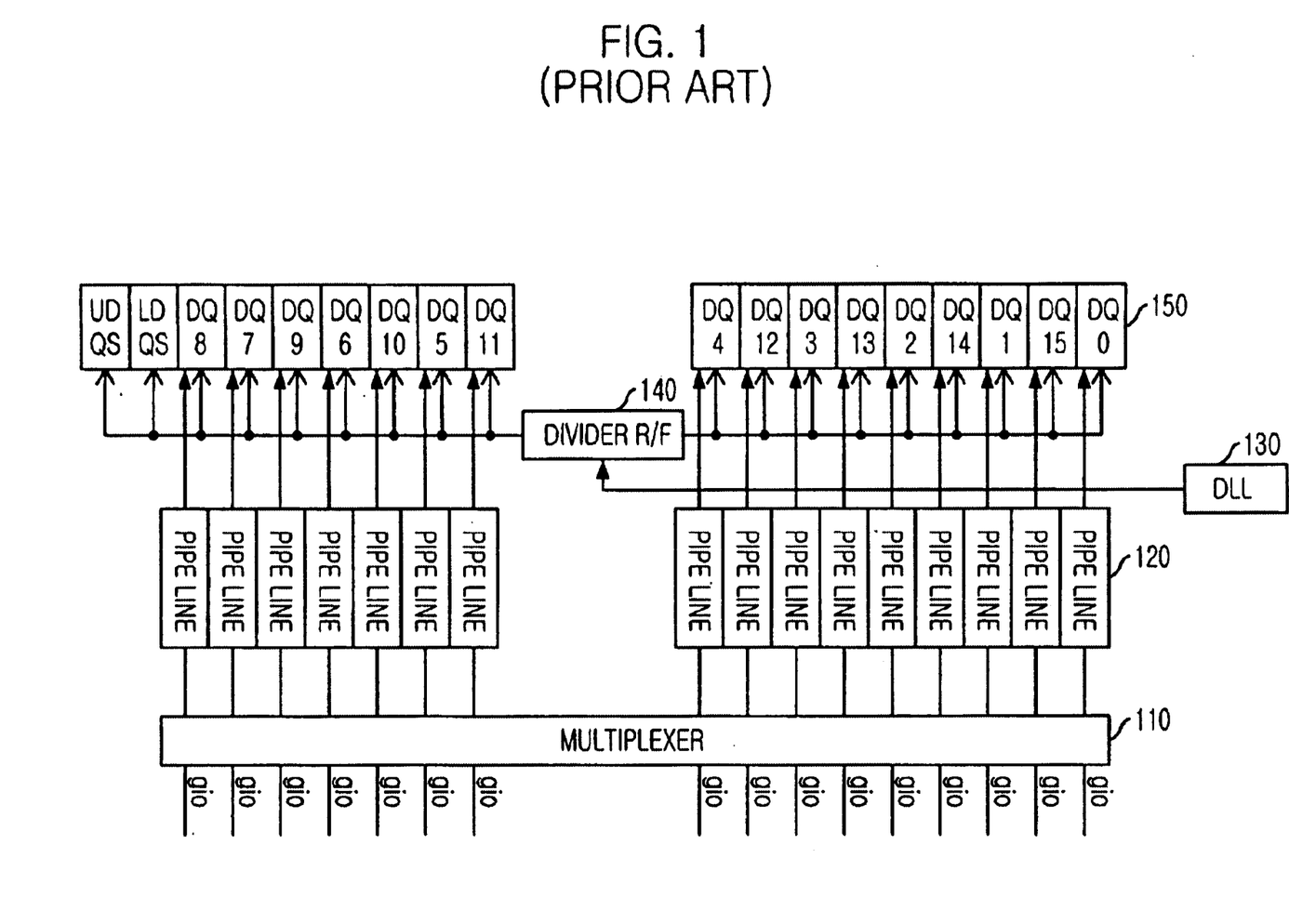
FIG. 1 is a block diagram of a data output path within a conventional DRAM chip.

FIG. 1 is a block diagram of a data output path within a conventional DRAM chip.

A cell data outputted from DRAM storage cells (memory cell array, not shown) is loaded on a global input/output (GIO) line through a sense amplifier (not shown). Then, the data loaded on the GIO line is transferred to a multiplexer (MUX) 110. The multiplexer 110 supports to select 4, 8 and 16 applications depending on purposes of DRAM.

A data outputted from the multiplexer 110 is loaded on a data register 120 (in case of a parallel pipeline scheme, the data register 120 is configured with two or five parallel-connected registers) within a pipeline. A data that is transferred from the data register to a data output driver is outputted to an outside of the chip in synchronization with a clock, which is outputted through a divider R/F 140. The divider R/F 140 supplies the clock to the data output driver 150 only at a desired timing by logically combining an output data of the data register and an output clock of a DLL 130, which is outputted in synchronization with an external clock. Also, the divider R/F 140 determines an enable timing of the data output driver 150 that transfers the output data of the data register of the pipeline to an outside using the DLL clock outputted in synchronization with the external clock. At this time, the timing is generated based on CAS latency and burst length (BL), which are required to the DRAM. In the data output driver 150, UDQS is an upper data strobe and LDQS is a lower data strobe.

Figure 2:
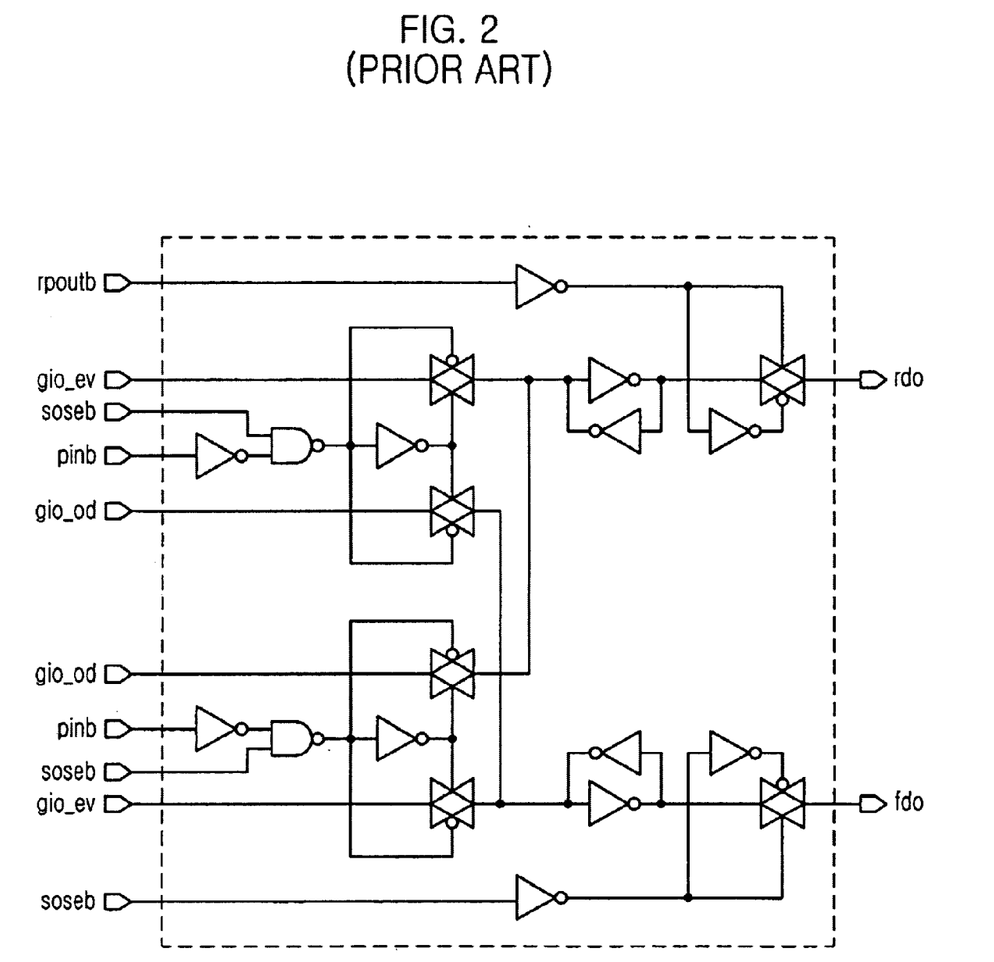
FIG. 2 is a circuit diagram of a data register in a pipeline.

FIG. 2 is a circuit diagram of a data register in a pipeline.

The data register can select data of GIO odd and even lines, and an input timing of the data register is determined by the control signal. The clock that determines this timing uses a clock that determines a timing of loading a data of a storage cell on a GIO line. In the data register of the pipeline, a timing in which data loaded on the GIO odd and even lines gio_od and gio_ev are inputted to the data register is determined by a soseb signal and a pinb signal. In other words, if the soseb signal is a logic low level, an input of data loaded on the GIO odd and even lines gio_od and gio_ev to the data register is blocked, and if the soseb signal is a logic high level, the input of data to the data register is permitted. The data is inputted in synchronization with the pinb signal that leads DLL clocks rclk_dll and fclk_dll. An rpoutb signal and an fpoutb signal are clocks that determine an output timing of data inputted to the data register. While the rpoutb signal and the fpoutb signal leads the DLL clocks rclk_dll and fclk_dll, the rpoutb signal and the fpoutb signal lags behind the pinb signal.

Specifically, in case of a universal DRAM for PC/laptop/workstation/server, DDR SDRAM includes sixteen data output drivers, and in case of DRAM for graphic use, DDR SDRAM includes thirty-two data output drivers. Data stored in the storage cells of the DRAM are inputted to each of the data output drivers 150. The data inputted to the data output drivers 150 are outputted in synchronization with an output clock that is outputted from the delay locked loop (DLL).

Figure 3:
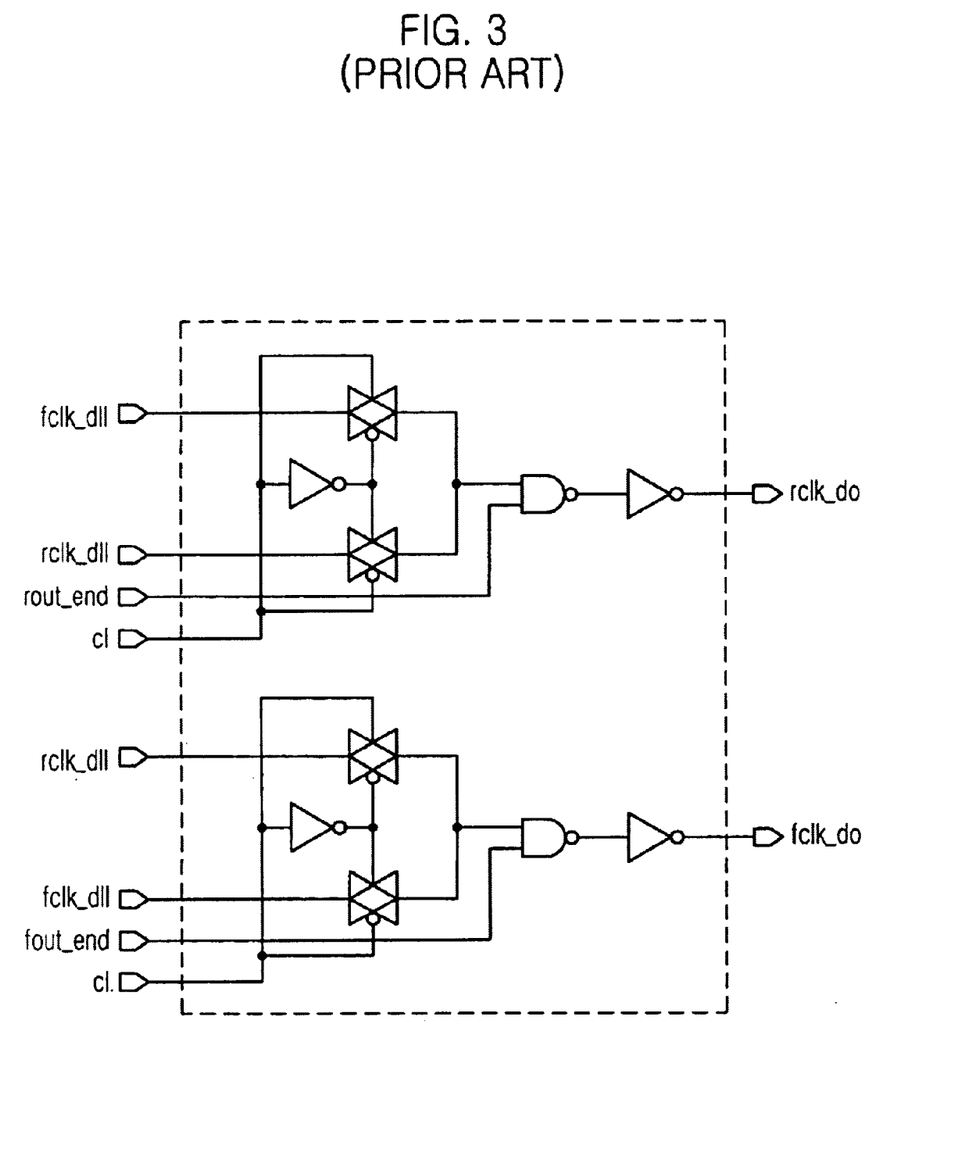
FIG. 3 is a circuit diagram of a conventional divider R/F.

FIG. 3 is a circuit diagram of a conventional divider R/F.

The divider R/F 140 operating in response to the DLL clocks rclk_dll and fclk_dll transfers DLL output clocks rclk_do and fclk_do to the data output driver using CAS latency (CL) information. The CAS latency (CL) is a regulation for data exchange between chipset and DRAM. The CAS latency is a time until data is transferred from the DRAM to the chipset after a read command is transferred from the chipset to the DRAM. If the CAS latency (CL) is an integer, the rising clock rclk_dll is outputted along a path of an output driver rising clock rclk_do and the falling clock fclk_dll is outputted along a path of an output driver falling clock fclk_do. On the other hand, if the CAS latency (CL) is x.5, the rising clock rclk_dll is outputted along the path of the output driver falling clock fclk_do and the falling clock fclk_dll is outputted along the path of the output driver rising clock rclk_do.

Meanwhile, among parameters that represent time characteristics determined by Joint Electron Device Engineering Council (JEDEC), tAC, tDQSQ and tDQSCK are associated with valid window width of data or clock, which is outputted from the data output driver. These parameters will be described below in brief.

tAC is a skew between output data signals (DQ) and means a time difference between a data signal, which passes power supply voltage/2 (VDDQ/2) earliest, and a data signal, which passes power supply voltage/2 (VDDQ/2) most lately. tDQSQ is a time difference between data strobe signal (DQS) and data signal (DQ) and means a time difference between data strobe signal (DQS) passing VDDQ/2 and data signal (DQ) having the largest time difference in time domain. tDQSCK is a skew between an external clock and the data strobe signal.

Here, the skew between the data signals (DQ) occurs due to several factors. A first factor is skew or jitter of DLL itself caused because the skew changes depending on the implementing method of DLL circuit. A second factor is a skew occurring due to a mismatch of a clock distribution network, that is, a difference between a position that DLL clock reaching the DQ block reaches earliest and a position that DLL clock reaches latest. A third factor is a mismatch of RLC due to a length difference of lead frames between DQ pins and bonding wires because chip sizes are different and locations of pads are different. A fourth factor is a difference of data patterns outputted from DQ pins. A fifth factor is a mismatch of RLC on PCB connected to DQ pins. Except for the fourth factor, the other factors are hardware factors. However, the fourth factor is changed depending on data transmission patterns, not hardware factor.

Figure 4:
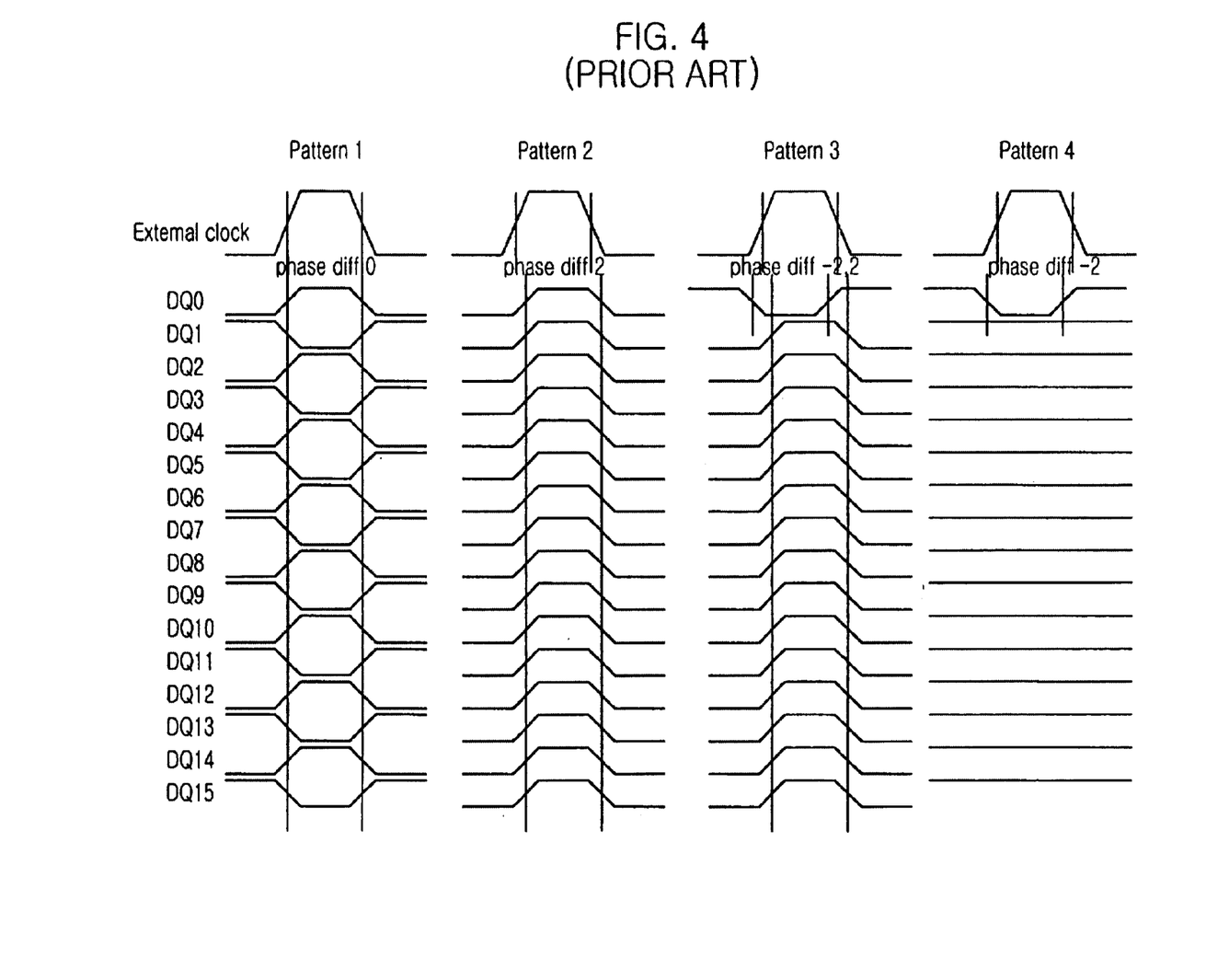
FIG. 4 shows skew occurrence based on data patterns according to the prior art.

Data transmission patterns include a first case (ALL) that all data are transferred in the same direction, a second case (HALF) that half the data are transferred to one direction and the other data are transferred to another direction, a third case that most data are transferred in one direction, while the other data are transferred to another direction. In the third case, the other data may be one data (SS0). FIG. 4 shows skew occurrence based on data patterns according to the prior art.

In case when all data are transferred in the same direction, power supply voltage VDDQ or ground voltage VSSQ may be shaken due to instantaneous current consumption when pull-up transistors or pull-down transistors are turned on/off. On the other hand, in case when only one of data DQ is transferred to a different direction, pull-up transistors of seventeen data output drivers among eighteen data output drivers are turned on and a pull-down transistor of one data output driver is turned on. In this case, current flow of one pull-down transistor is smoother than the turned-on seventeen pull-up transistors, so that data DQ are transferred faster through the pull-down transistor than through the pull-up transistor. FIG. 4 exemplarily shows the skew between data DQ in each case. In FIG. 4, pattern 1 is a HALF case, pattern 2 is an ALL case, and patterns 3 and 4 are SS0 cases.

In case of DDR SDRAM 400, skew that occurs depending on data transmission patterns may have a very large value of about maximum 300 psec. Therefore, valid window width of data is reduced in the semiconductor device operating at a high speed, resulting in degradation of performance.

SUMMARY OF THE INVENTION

It is, therefore, an object of the present invention to provide a semiconductor device which is capable of minimizing a skew occurring due to a change of data pattern by previously recognizing data pattern before data are outputted from the semiconductor device.

In an aspect of the present invention, there is provided an apparatus of compensating for a phase delay in a semiconductor device having a delay locked loop (DLL) for generating DLL clock. The semiconductor device includes: a data pattern detection block for detecting patterns of data loaded on data line and determining delay compensation amount of the data inputted to data output driver based on the detected data patterns; and a delay compensation block for compensating for phase delay of clock relating to the DLL clock inputted to the data output driver under a control of an output signal of the data pattern detection block.

The data pattern detection block includes: a storage means for storing the delay compensation amount based on the data patterns; and an interface means for connecting the storage means to peripheral circuits.

The storage means includes: a decoder for decoding the data patterns; and a storage device for receiving an output of the decoder and outputting the delay compensation amount required in the data pattern.

Unit storage cell for delay compensation use within the storage device is controlled by the output of the decoder and outputs a first logic level in a turned-on state.

The interface means includes: a front trigger unit for receiving data loaded on the data line; an end trigger unit for processing an output of the storage means; and a clock generator for generating a clock that controls the front trigger unit and the end trigger unit.

The front trigger unit includes individual triggers, each of which includes: a first transmission gate for alternately transferring an odd data of the data line in response to edges of the clocks generated from the clock generator; a second transmission gate for alternately transferring an even data of the data line in response to edges of the clocks generated from the clock generator; and a latch for temporarily storing the odd and even data.

The end trigger unit includes individual end triggers, each of which includes: a transmission gate for transferring the delay compensation amount in response to the clocks outputted from the clock generator; and a latch for temporarily storing an output of the transmission gate.

The delay compensation block controls a transmission speed of the data signal that is outputted to the data output driver in response to an output of the pattern detection block.

The delay compensation block includes a driver for transferring the data signal and a current source transistor part connected to the driver, the delay compensation block adjusting an amount of current transferred to the driver by controlling size of the current source transistor part in response to the output of the pattern detection block.

In another aspect of the present invention, a method of compensating for a phase delay in a semiconductor device having a delay locked loop (DLL) for generating DLL clock includes the steps of: a) detecting patterns of data loaded on data line and determining delay compensation amount of the data inputted to data output driver based on the detected data patterns; and b) compensating for phase delay of clock relating to the DLL clock inputted to the data output driver based on the delay compensation amount.

The step a) includes the steps of: decoding the data pattern; and outputting the delay compensation amount required in the data pattern.

The step b) controls a transmission speed of the data signal outputted to the data output driver in response to the delay compensation amount.

The present invention uses an algorithm of reading patterns of data that are transferred along data lines from memory cell array. Data skew that may occur in an operation of DRAM can be estimated in advance according to the patterns of data transferred from the memory cell array. Also, it is possible to prevent the occurrence of skew.

Based on the patterns of data transferred along the data line from the memory cell array, the delay of the DLL clocks is controlled in front of the data output driver. The present invention relates to a method for improving the fourth factor among the above-described four factors.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 5:
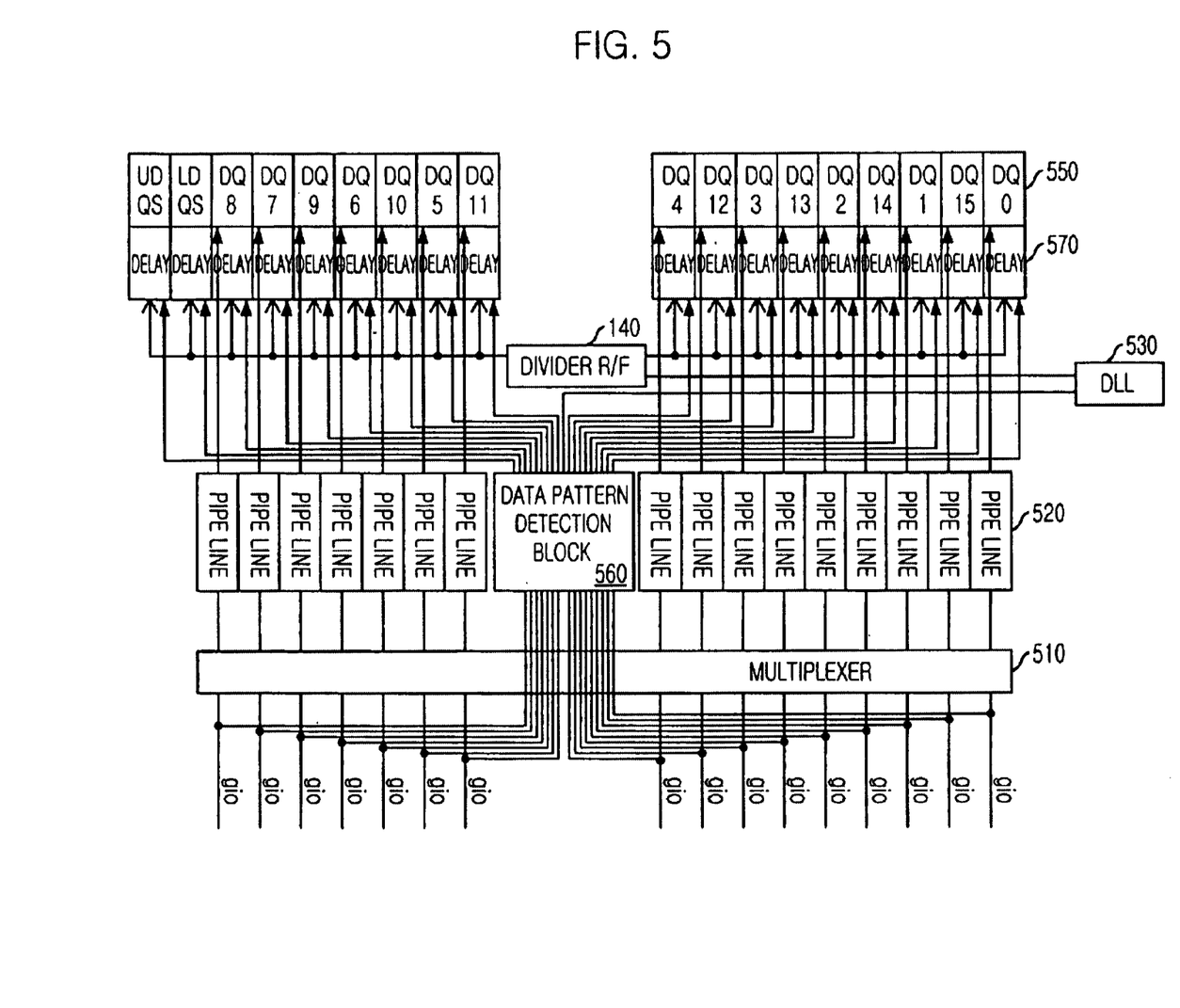
FIG. 5 is a block diagram of a data output path within DRAM chip in accordance with an embodiment of the present invention.

FIG. 5 is a block diagram of a data output path within DRAM chip in accordance with an embodiment of the present invention.

The data output path within the DRAM chip in accordance with the present invention includes a data pattern detection block 560 disposed between global input/output line GIO and delay unit, and a delay compensation block 570 disposed between the data pattern detection block 560 and data output driver 550.

Figure 6:
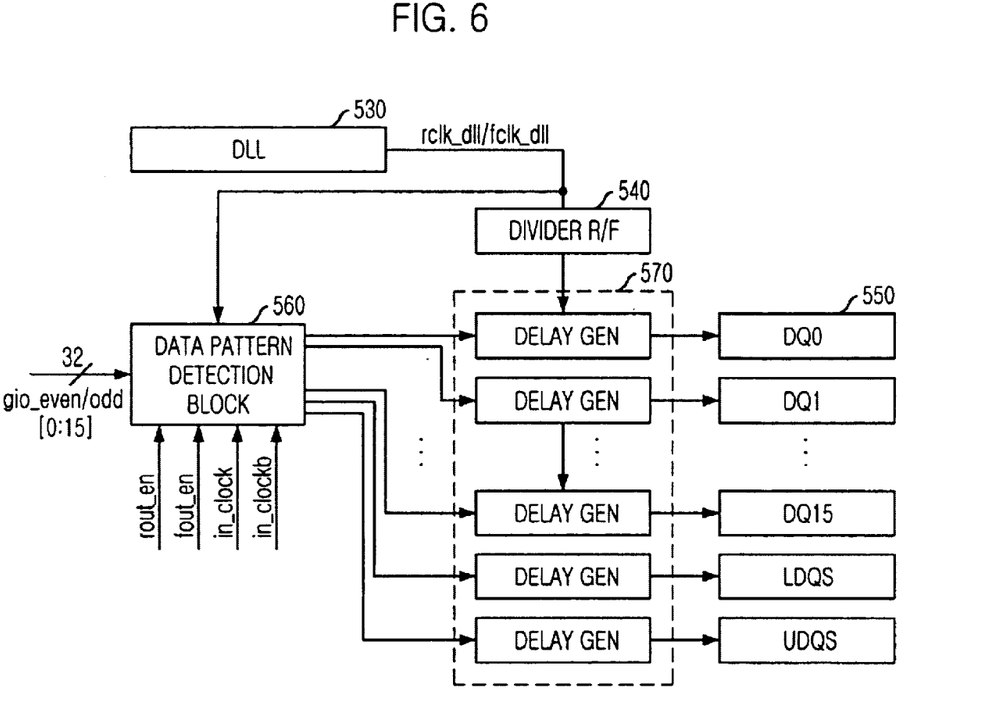
FIG. 6 is a block diagram of an apparatus for reducing a data skew in accordance with an embodiment of the present invention.

FIG. 6 is a block diagram of an apparatus for reducing a data skew in accordance with an embodiment of the present invention.

Referring to FIG. 6, the apparatus for reducing the data skew includes the data pattern detection block 560 and the delay compensation block 570. The data pattern detection block 560 detects patterns of data loaded on the global input/output line GIO from a memory cell array of DRAM and determines phase delay amount of data inputted to the data output drivers. The delay compensation block 570 compensates for delay of DLL clocks inputted from the divider R/F 540 to the data output drivers 550 under a control of an output signal of the data pattern detection block 560. The data output driver 550 outputs even data and odd data, which are inputted from the global input/output line GIO, in synchronization with the delay-compensated DLL clocks outputted from the delay compensation block 570.

Figure 7:
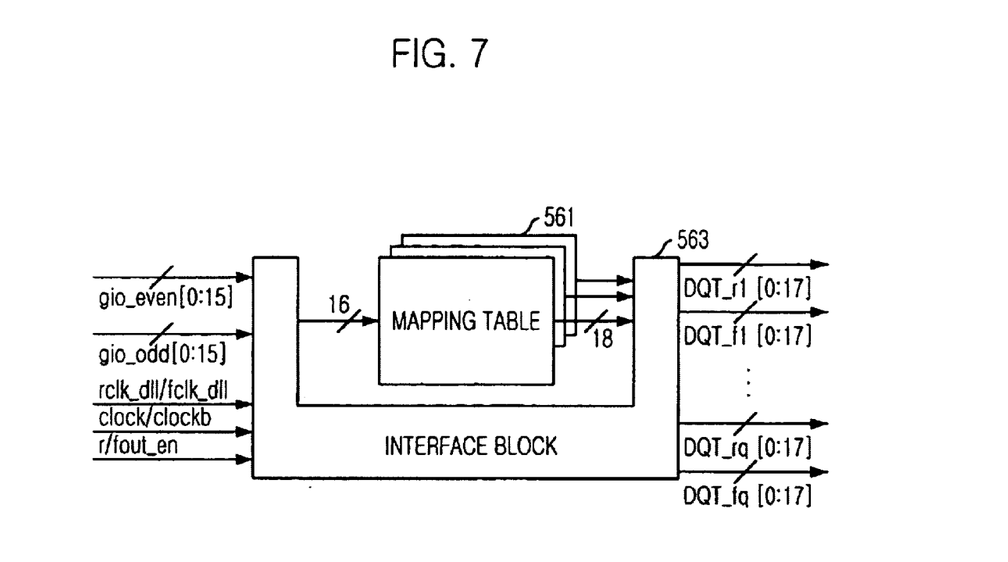
FIG. 7 is a block diagram of a data pattern detection block in accordance with an embodiment of the present invention.

FIG. 7 is a block diagram of the data pattern detection block in accordance with an embodiment of the present invention.

Referring to FIG. 7, the data pattern detection block includes a mapping table 561 and an interface block 563. The mapping table 561 stores delay compensation amount that is different depending on the data patterns, and the interface block 563 connects the mapping table 561 to peripheral circuits.

The number of mapping tables is proportional to information amount that is transferred from the data pattern detection block 560 and the delay compensation block 570. For example, if the delay compensation block 570 compensates the delay in three stages, the mapping table 561 can also be configured with three sets. Meanwhile, the mapping table 561 previously stores delay compensation information on skews for each data pattern in a design stage.

Figure 8:
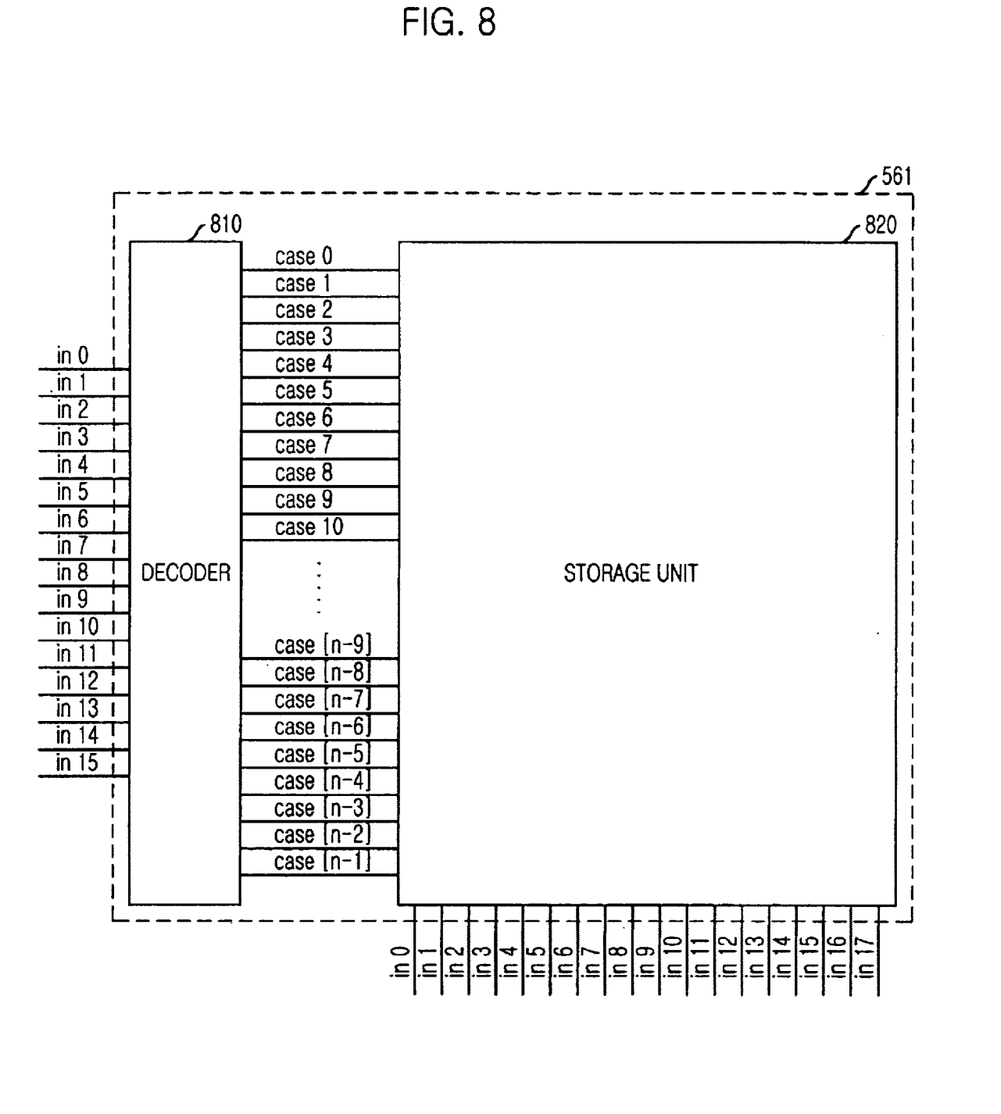
FIG. 8 is a block diagram of a mapping table within a data pattern detection block in accordance with an embodiment of the present invention.

FIG. 8 is a block diagram of the mapping table within data pattern detection block in accordance with an embodiment of the present invention.

Figure 9:
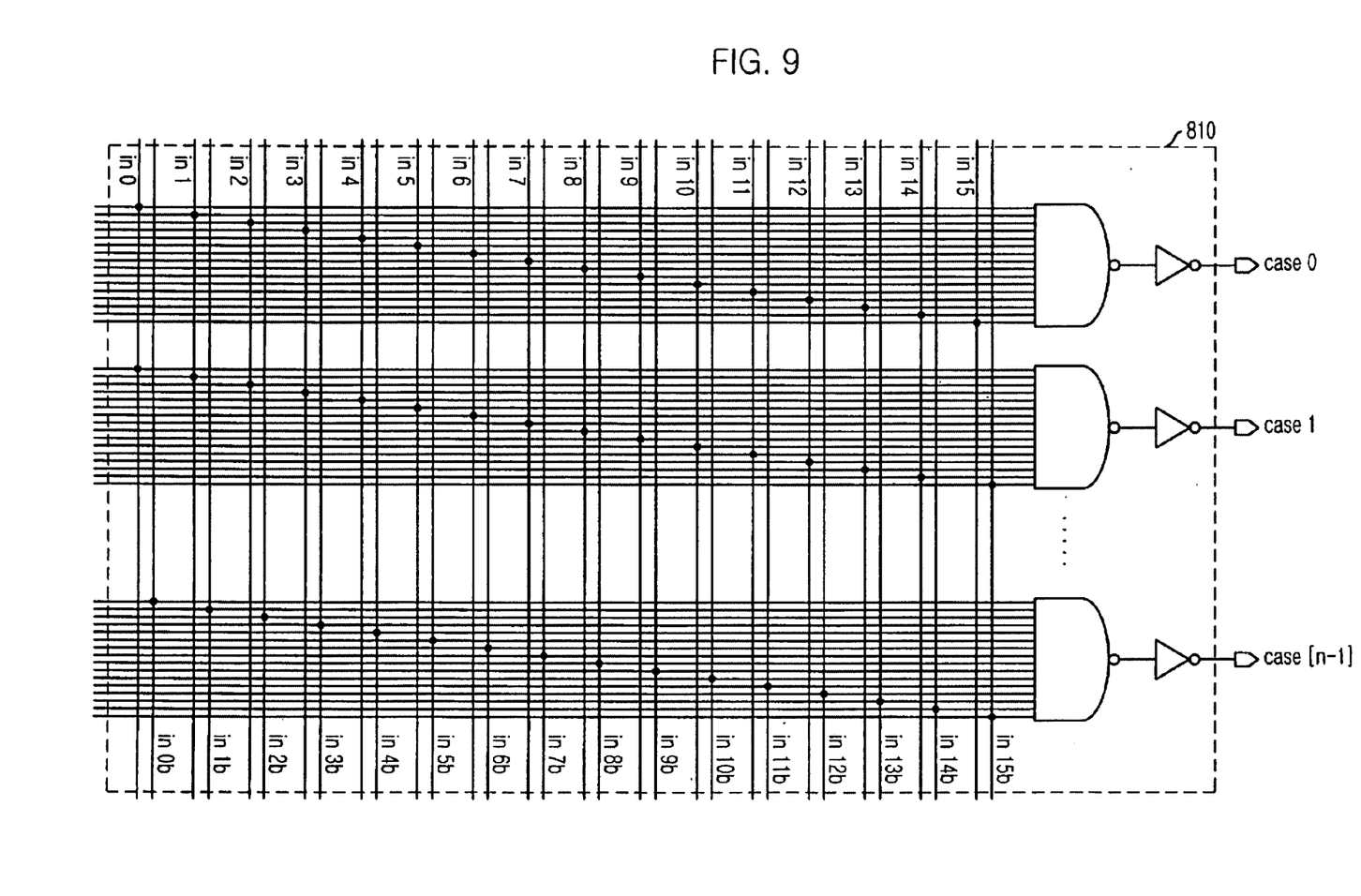
FIG. 9 is a circuit diagram of a decoder within a mapping table in accordance with an embodiment of the present invention.

The mapping table may be configured with a decoder 810 and a storage unit 820. If the decoder that may include sixteen inputs in0 to in15 and maximum 65536 outputs case0 to case[n−1] enables an output line of a case corresponding to an inputted data pattern, the storage device 820 outputs a stored delay amount of the corresponding case. A circuit configuration of the decoder 180 is shown in FIG. 9.

Figure 10:
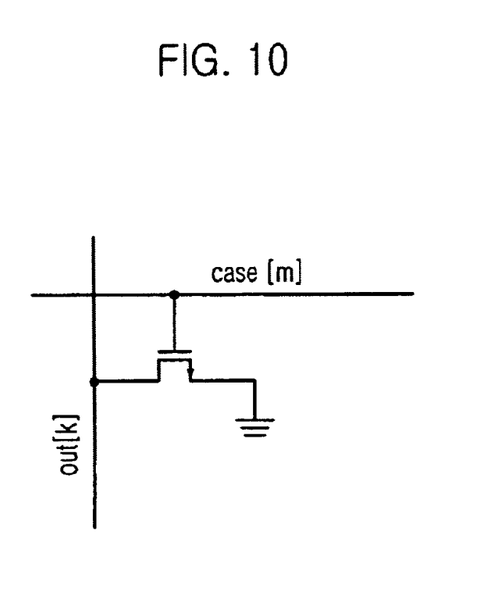
FIG. 10 is a circuit diagram of a unit storage cell for delay increase use within a storage device in accordance with an embodiment of the present invention.
Figure 11:
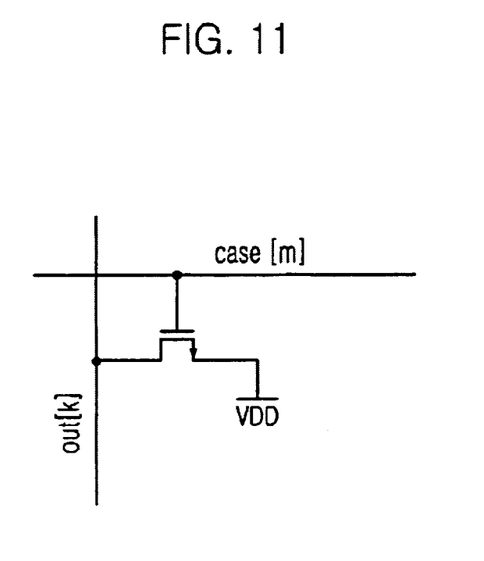
FIG. 11 is a circuit diagram of a unit storage cell for delay decrease use within a storage device in accordance with an embodiment of the present invention.

Meanwhile, data value of each unit storage cell can be determined by connecting a source terminal to Vdd or Vss in design. FIG. 10 is a circuit diagram of a unit storage cell for delay increase use within the storage device in accordance with an embodiment of the present invention, and FIG. 11 is a circuit diagram of a unit storage cell for delay decrease use within the storage device in accordance with an embodiment of the present invention.

In case of the unit storage cell for delay increase use, if the case[m] among the inputs of the storage device 820 becomes a logic high level, the unit storage cell having the source connected to Vss outputs an output signal out[k] of logic low level. Also, in case of the unit storage cell for delay decrease use, if the case[m] among the inputs of the storage device 820 becomes a logic high level, the unit storage cell having the source connected to Vdd outputs an output signal out[k] of logic nigh level.

Figure 12:
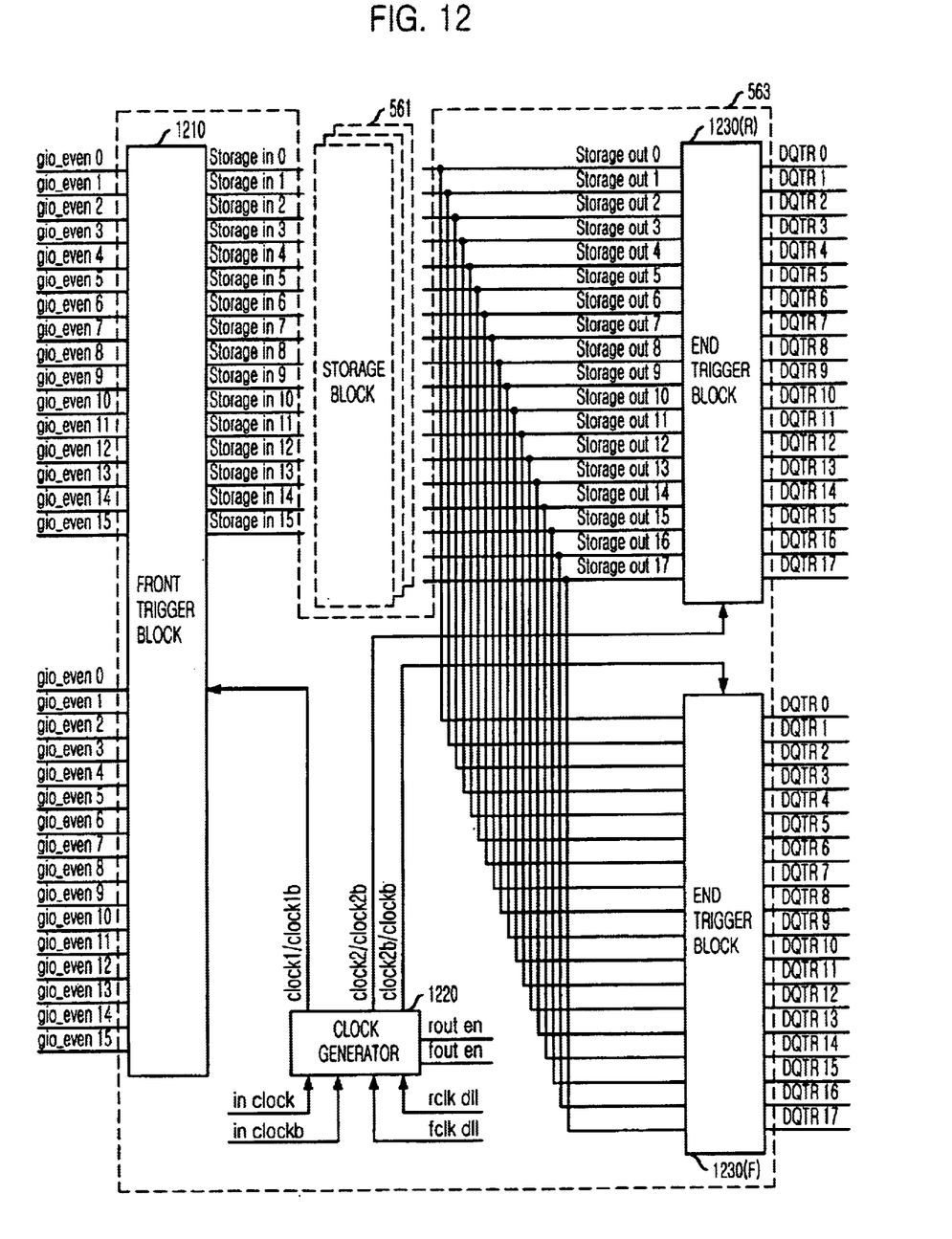
FIG. 12 is a block diagram of an interface block within a data pattern detection block in accordance with an embodiment of the present invention.

FIG. 12 is a block diagram of the interface block within the data pattern detection block in accordance with an embodiment of the present invention.

Referring to FIG. 12, the interface block 563 includes a front trigger block 1210 receiving data loaded on the global input/output line, an end trigger block 1230 managing to output the mapping table, and a clock generator 1220 for generating clocks that control the front trigger block and the end trigger block. Since the front trigger block 1210 receives data loaded on the data lines, the front triggers are used as many as the number of the data lines.

Figure 13:
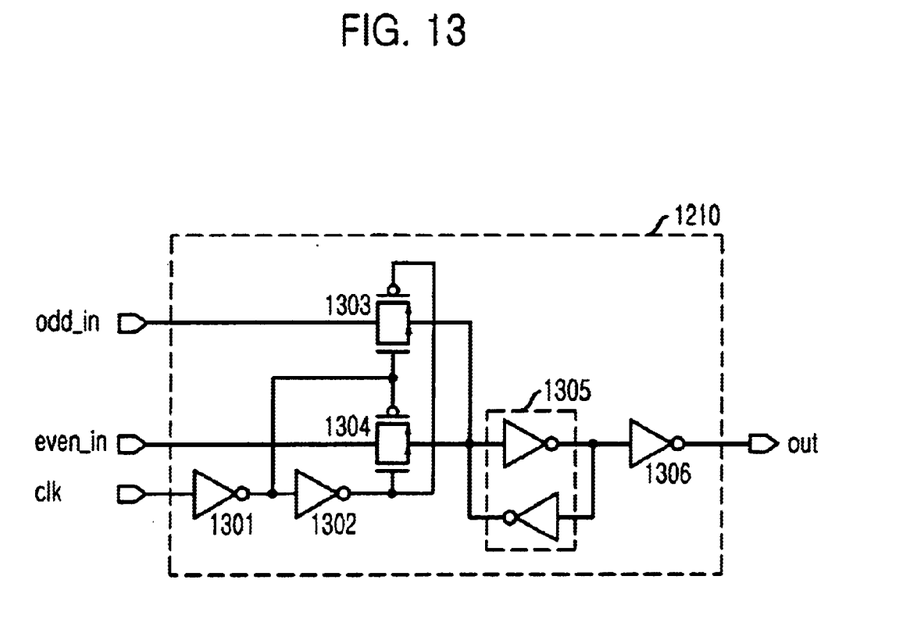
FIG. 13 is a circuit diagram of an individual front trigger within a front trigger block in accordance with an embodiment of the present invention.

FIG. 13 is a circuit diagram of the individual front trigger within the front trigger block in accordance with an embodiment of the present invention.

Referring to FIG. 13, the individual front triggers of the front trigger block 1210 can be configured to separately receive data using the clock clk outputted from the clock generator 1220 because the even and odd data of the data lines are loaded at the same time. In other words, the individual front trigger includes a transmission gate 1303 for alternately transferring the odd data in response to the edges of the clock clk, a transmission gate 1304 for transferring the even data in response to the edges of the clock clk, and a latch 1305 for temporarily storing the odd data and the even data, which are outputted alternately.

Figure 14:
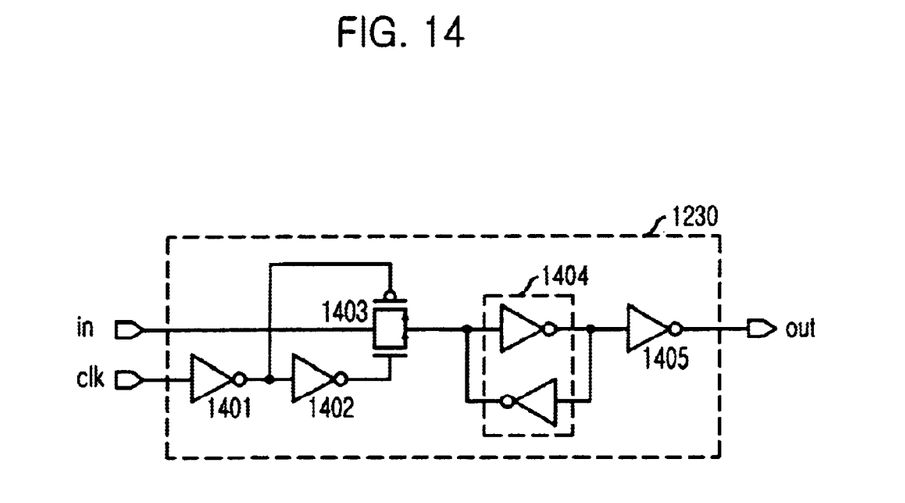
FIG. 14 is a circuit diagram of an individual end trigger within an end trigger block in accordance with an embodiment of the present invention.

FIG. 14 is a circuit diagram of the individual end trigger within the end trigger block in accordance with an embodiment of the present invention.

Referring to FIG. 14, the individual end trigger includes a transmission gate 1403 for transferring the input data in response to the clock clk, and a latch 1404 for temporarily storing data that is outputted from the transmission gate 1403. At this time, the clock clk may be a clock used to manage the output of the data register within the pipeline.

Figure 15:
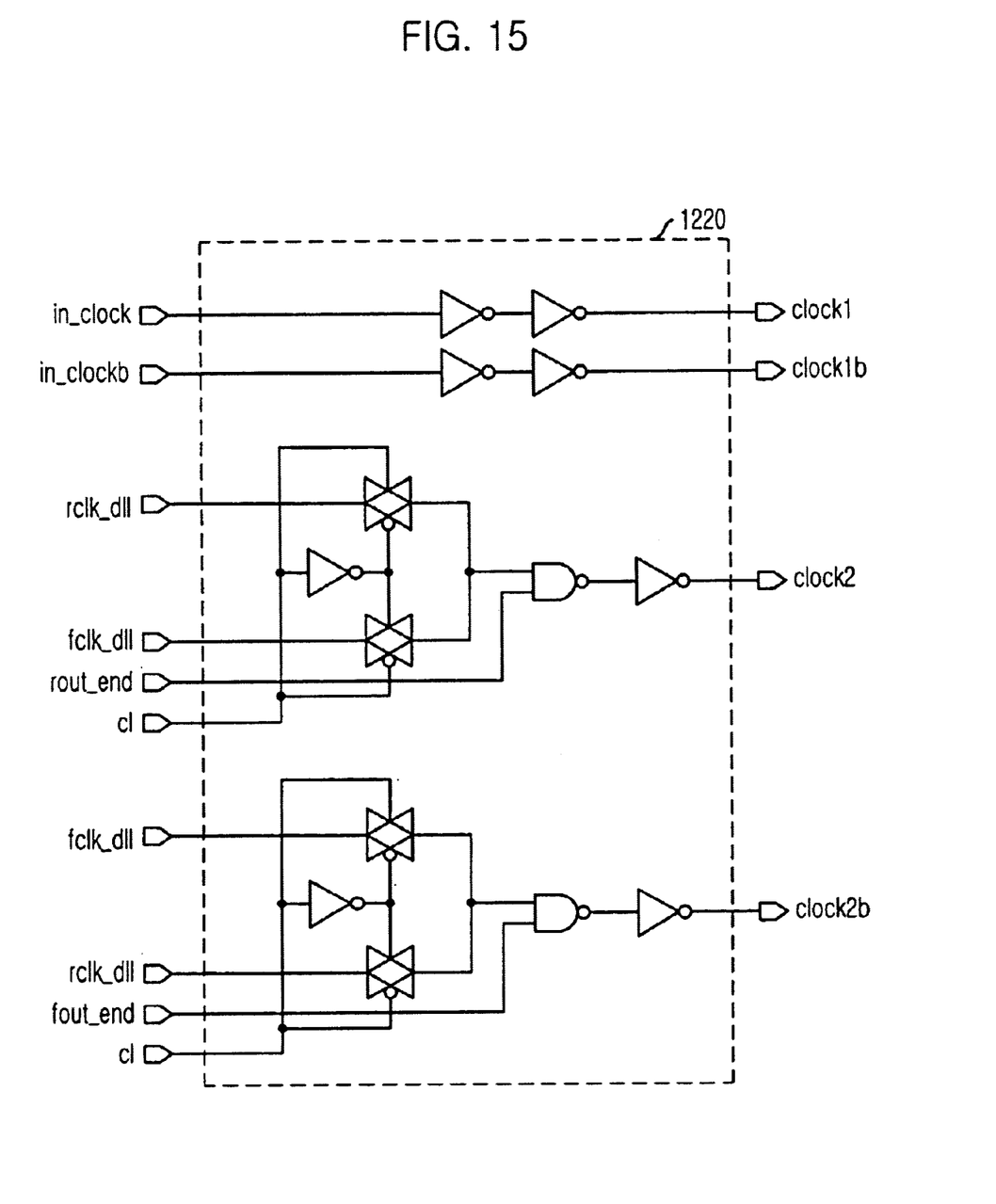
FIG. 15 is a circuit diagram of a clock generator within an interface block in accordance with an embodiment of the present invention.

FIG. 15 is a circuit diagram of the clock generator within the interface block in accordance with an embodiment of the present invention.

Referring to FIG. 15, signals in_clock and in_clockb having the same phase as the input clock of the data register are buffered and outputted as signals clock1 and clock1b, respectively. When the read command is generated, the DLL rising clock rclk_dll and the DLL falling clock fclk_dll that are alternately outputted according to the CAS latency signal cl are outputted as a signal clock2 in response to a rising edge output enable signal rout_end. In the same manner, when the read command is generated, the DLL rising clock rclk_dll and the DLL falling clock fclk_dll that are alternately outputted according to the CAS latency signal cl are outputted as a signal clock2b in response to a falling edge output enable signal fout_end.

Figure 16:
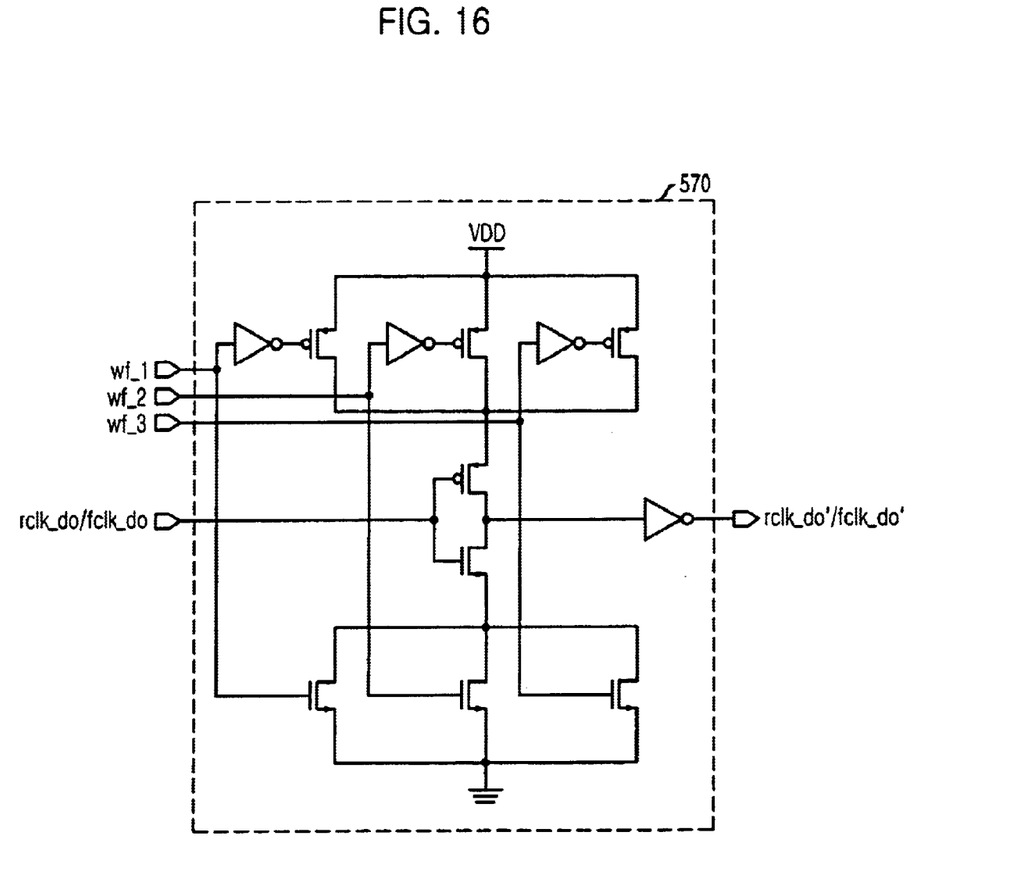
FIG. 16 is a circuit diagram of a delay compensation block in accordance with an embodiment of the present invention.

FIG. 16 is a circuit diagram of the delay compensation block in accordance with an embodiment of the present invention.

Referring to FIG. 16, the delay compensation block 570 includes a driver for transferring data signal, and a current source transistor part connected to the driver. The delay compensation block 570 can adjust an amount of current transferred to the driver by controlling size of the current source transistor part in response to the output of the pattern detection block. In other words, the delay of the data signal can be increased or decreased by controlling a transmission speed of the data signal outputted to the data output driver according to the outputs of the end trigger block 1230(R) and 1230(F).

For example, assuming it is basic that two pairs of upper/lower transistors among three pairs of upper/lower transistors are turned on by applying gate control signals wf1 and wf2 of logic high level and a gate control signal wf3 of logic low level, if only one pair of upper/lower transistors are turned on, a current of the driver is reduced, so that a delay of the data signal is increased. If three pairs of upper/lower transistors are all turned on, a current of the driver is increased, so that a delay of the data signal is reduced.

Considering the addition of the delay compensation block, the delay of the data signal can be solved by a design of a reflicker model within the delay locked loop.

Figure 17:
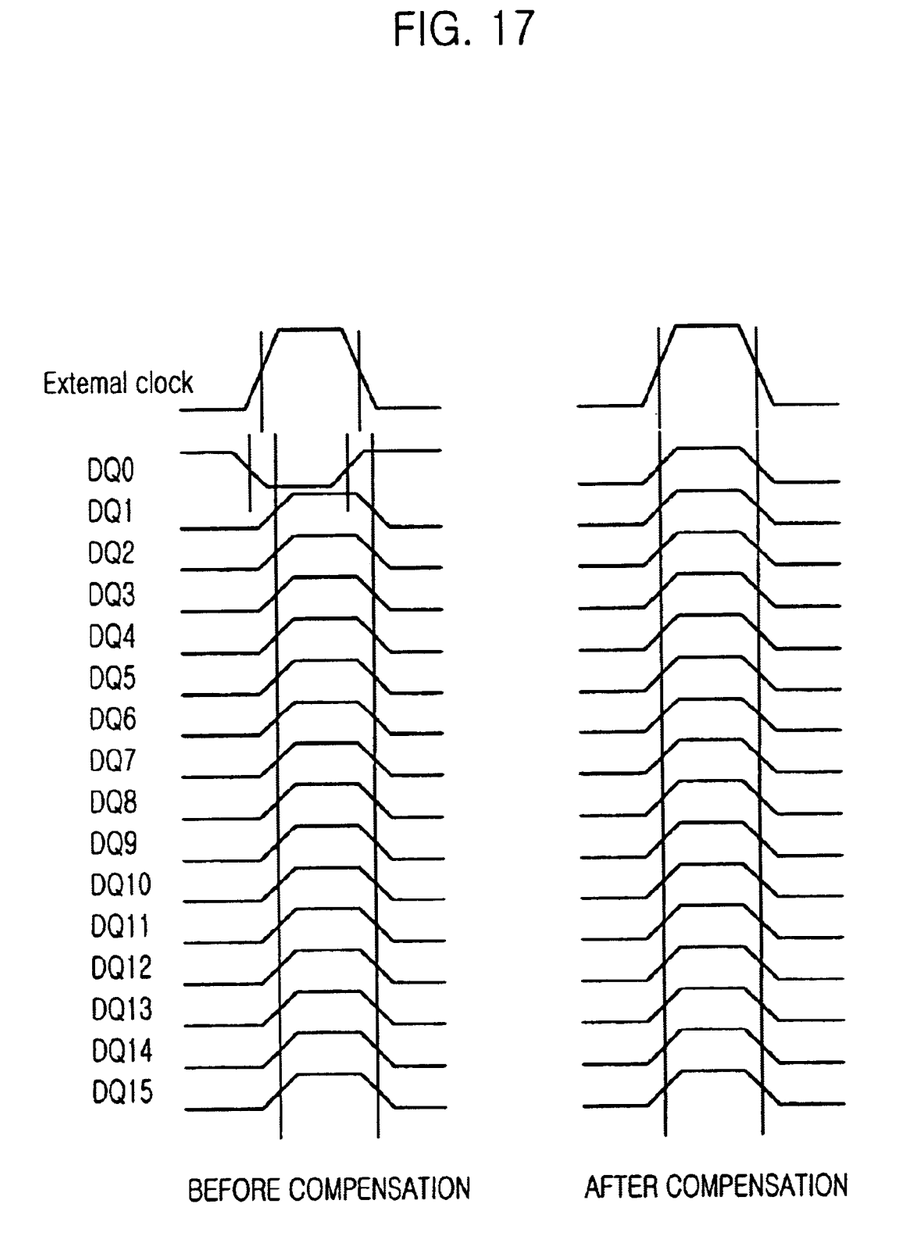
FIG. 17 is a timing diagram illustrating a skew compensation of data pattern in accordance with an embodiment of the present invention.

FIG. 17 is a timing diagram illustrating a skew compensation of data pattern in accordance with an embodiment of the present invention.

Referring to FIG. 17, before the skew of the data signal is compensated, one logic low signal among the output data of the data output driver leads the external clock, and the others lag behind the external clock. After the compensation, phases of all data signals are matched with a phase of the external clock.

The present application contains subject matter related to Korean patent application No. 2003-57854, filed in the Korean Patent Office on Oct. 21, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An apparatus of compensating for a phase delay in a semiconductor memory device having a delay locked loop (DLL) for generating DLL clock, the semiconductor memory device comprising:
   a data pattern detection block for detecting patterns of data loaded on a data line and determining a delay compensation amount of the data inputted to a data output driver based on the detected data patterns; and
   a delay compensation block for compensating for phase delay of clock relating to the DLL clock inputted to the data output driver under a control of an output signal of the data pattern detection block.

2. The apparatus as recited in claim 1, wherein the data pattern detection block includes:
   a storage means for storing the delay compensation amount based on the data patterns; and
   an interface means for connecting the storage means to peripheral circuits.

3. The apparatus as recited in claim 2, wherein the storage means includes:
   a decoder for decoding the data patterns; and
   a storage device for receiving an output of the decoder and outputting the delay compensation amount required in the data pattern.

4. The apparatus as recited in claim 3, wherein unit storage cell for delay compensation use within the storage device is controlled by the output of the decoder and outputs a first logic level in a turned-on state.

5. The apparatus as recited in claim 2, wherein the interface means includes:
   a front trigger unit for receiving data loaded on the data line;
   an end trigger unit for processing an output of the storage means; and
   a clock generator for generating a clock that controls the front trigger unit and the end trigger unit.

6. The apparatus as recited in claim 5, wherein the front trigger unit includes individual front triggers, each individual front trigger including:
   a first transmission gate for alternately transferring an odd data of the data line in response to edges of the clocks generated from the clock generator;
   a second transmission gate for alternately transferring an even data of the data line in response to edges of the clocks generated from the clock generator; and
   a latch for temporarily storing the odd and even data.

7. The apparatus as recited in claim 5, wherein the end trigger unit includes individual end triggers, each individual end trigger including:
   a transmission gate for transferring the delay compensation amount in response to the clocks outputted from the clock generator; and
   a latch for temporarily storing an output of the transmission gate.

8. The apparatus as recited in claim 1, wherein the delay compensation block controls a transmission speed of the data signal that is outputted to the data output driver in response to the output of the data pattern detection block.

9. The apparatus as recited in claim 1, wherein the delay compensation block includes a driver for transferring the data signal and a current source transistor connected to the driver, the delay compensation block adjusting an amount of current transferred to the driver by controlling the size of the current source transistor in response to the output of the data pattern detection block.

10. A method of compensating for a phase delay in a semiconductor memory device having a delay locked loop (DLL) for generating DLL clock, the method comprising the steps of:
   a) detecting patterns of data loaded on a data line and determining a delay compensation amount of the data inputted to a data output driver based on the detected data patterns; and
   b) compensating for phase delay of clock relating to the DLL clock inputted to the data output driver based on the delay compensation amount.

11. The method as recited in claim 10, wherein the step a) includes the steps of:
   decoding the data pattern; and
   outputting the delay compensation amount required in the data pattern.

12. The method as recited in claim 11, wherein the step b) controls a transmission speed of the data signal outputted to the data output driver in response to the delay compensation amount.

* * * * *